(12) United States Patent
Kom et al.

(10) Patent No.: US 11,092,614 B1
(45) Date of Patent: Aug. 17, 2021

(54) MEASURING AIRFLOW FOR COMPUTING DEVICES

(71) Applicant: Core Scientific, Inc., Bellevue, WA (US)

(72) Inventors: Lawrence Kom, Redmond, WA (US); Thomas Fuller, Seattle, WA (US)

(73) Assignee: Core Scientific, Inc., Bellevue, WA (US)

( * ) Notice: Subject to any disclaimer, the term of this patent is extended or adjusted under 35 U.S.C. 154(b) by 0 days.

(21) Appl. No.: 17/076,711

(22) Filed: Oct. 21, 2020

Related U.S. Application Data

(63) Continuation of application No. 16/938,085, filed on Jul. 24, 2020.

(51) Int. Cl.
| | | |
|---|---|---|
| *G01P 5/00* | (2006.01) | |
| *G06F 1/3296* | (2019.01) | |
| *H05K 7/20* | (2006.01) | |
| *G06F 11/30* | (2006.01) | |
| *G06F 1/3206* | (2019.01) | |
| *G06F 1/20* | (2006.01) | |

(52) U.S. Cl.
CPC ............... *G01P 5/00* (2013.01); *G06F 1/206* (2013.01); *G06F 1/3206* (2013.01); *G06F 1/3296* (2013.01); *G06F 11/3058* (2013.01); *H05K 7/20172* (2013.01); *H05K 7/20209* (2013.01); *H05K 7/20572* (2013.01)

(58) Field of Classification Search
CPC .. G01P 5/00; H05K 7/20172; H05K 7/20572; H05K 7/20209; G06F 1/206; G06F 11/3058; G06F 1/3296; G06F 1/3206
See application file for complete search history.

(56) References Cited

U.S. PATENT DOCUMENTS

| | | | |
|---|---|---|---|
| 8,805,590 B2* | 8/2014 | Bahali | H05K 7/20836 700/282 |
| 9,677,782 B1* | 6/2017 | Mecozzi | F04D 25/166 |
| 2005/0174737 A1* | 8/2005 | Meir | G06F 1/206 361/697 |
| 2006/0168975 A1* | 8/2006 | Malone | H05K 7/20836 62/180 |
| 2012/0215373 A1 | 8/2012 | Koblenz et al. | |
| 2013/0048266 A1 | 2/2013 | Bauchot et al. | |

(Continued)

*Primary Examiner* — Mohamed Charioui

(74) *Attorney, Agent, or Firm* — Fishman Stewart PLLC

(57) ABSTRACT

A method for measuring airflow for a plurality of computing devices may include characterizing the fan performance of a selected computing device of the plurality of computing devices to provide characterized RPM information. Each of the computing devices may include a cooling fan configured to exhaust heat into a hot aisle. Each cooling fan may include a rotor and a tachometer. The method may also include connecting the computing devices via a network, distributing computing workloads to the plurality of computing devices, and/or performing work on the computing workloads on the plurality of computing devices. Additionally, the method may include reading RPM information from the selected computing device's fan's tachometer and/or comparing the read RPM information with the characterized RPM information to determine a backpressure value for the selected computing device. The power to the selected computing device's fan may be reduced prior to reading the RPM information.

22 Claims, 13 Drawing Sheets

(56) References Cited

U.S. PATENT DOCUMENTS

| | | | |
|---|---|---|---|
| 2016/0120070 A1* | 4/2016 | Myrah | F04D 15/00 700/275 |
| 2017/0082112 A1* | 3/2017 | Barron | F04D 25/166 |
| 2019/0235449 A1* | 8/2019 | Slessman | G06F 9/5094 |
| 2019/0361508 A1* | 11/2019 | Yarragunta | H05K 7/20209 |

* cited by examiner

MEASURING AIRFLOW FOR COMPUTING DEVICES

CROSS-REFERENCE TO RELATED APPLICATIONS

This application is a Continuation of U.S. patent application Ser. No. 16/938,085, filed on Jul. 24, 2020, the disclosure of which is hereby incorporated by reference in its entirety.

TECHNICAL FIELD

The present disclosure generally relates to the field of computing and, more particularly, to systems and methods for measuring airflow for computing devices.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of the hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Data centers housing large numbers of miners or other CPU- or GPU-based systems may face cooling issues. This is due to the power usage, heat generation, and duty cycle common to these devices.

The heat in these data centers can exceed the cooling ability of a computing device's built-in fans, which force air across heat sinks on the computing device in order to extract and exhaust the waste heat. Traditional methods for improving cooling of computing devices in data centers include adding additional large external fans to increase airflow across the computing devices and using external cooling units that reduce the temperature of the air that is forced across the computing device by its built-in cooling fans. These methods have a significant drawback in that they use significant amounts of energy on top of the energy already used by the computing devices themselves.

Furthermore, even with these additional cooling methods, hot spots often occur within certain locations in data centers. For example, some computing devices farthest away from the data center's exhaust vents may see reduced airflow and therefore suffer from reduced cooling.

For at least these reasons, there is a desire for a solution to allow for improved efficient cooling of computing devices in a data center.

SUMMARY

An improved system and method for cooling a plurality of computing devices in a data center is contemplated. In one embodiment, the method comprises configuring the plurality of computing devices in a plurality of racks, with each computing device configured to exhaust heat in the same direction that is parallel to the other computing devices on the rack. Instructions are sent to the computing devices to set the computing devices' fan speed in a pattern. For example, the pattern may be linear or nonlinear, e.g., a ramp function or a gradient pattern in one or more directions (e.g. a two-dimensional linear gradient). The gradient pattern may be lower for the computing devices nearer to an exhaust opening and higher for devices farther from an exhaust opening. In some embodiments, the racks may be parallel to each other and exhaust in opposing directions, with the space between the racks bound by impermeable barriers and an exhaust port to funnel exhaust heat out. For example, the gradient pattern may be lower for the computing devices at one end of a rack (near a side exhaust opening) and higher for the computing devices at the other end, or it may be lower for computing devices at the top of a rack (near a top exhaust opening) and higher for devices at the bottom of the rack. Managing device settings such as fan speeds by patterns based for example on the physical location of the computing devices may improve cooling efficiency and ease of management.

A method for managing a data center housing a plurality of computing devices in a plurality of racks and connected via one or more network switches is also contemplated. In one embodiment, each switch may have a plurality of network ports, with each port associated with a different physical device location within the racks. In one embodiment the method may comprise sending instructions to set the fan speed of the computing devices in a pattern based on each computing device's location within the racks (as determined by its network port). The pattern may for example be a linear or non-linear gradient, one or two-dimensional, and may shift, rotate or change over time. Different patterns from a set of predefined patterns may be periodically selected and applied to the computing devices by sending updated management instructions to set the fan speed of the computing devices according to the newly changed or selected pattern. In addition, or in place of fan speed instructions, instructions to set other operating parameters such as operating frequency and or voltage according to a pattern may also be sent to the devices (e.g., with the highest desired frequency sent to devices nearest the exhaust opening, and the lowest desired frequencies sent to devices farthest from the exhaust opening, with a linear gradient being applied to the devices between).

A system for cooling computing devices in a data center is also contemplated. In one embodiment, the system may comprise one or more racks configured to support large numbers of computing devices in a two-dimensional array, with the computing devices each having one or more cooling fans configured to direct exhaust in a first direction perpendicular to the racks on which they are positioned. A control module such as a management computer running a management application may be connected to the computing devices via a network, and the control module may be configured to dispatch management instructions such as cooling fan speed setting instructions to the computing devices in a pattern (e.g. a one or two-dimensional gradient) that can shift, rotate, or change over time.

In some embodiments, the patterns may be adjusted based on measurements made within the data center (e.g., by measuring airflow in the hot aisle(s)). While installing network-enabled airflow measurement devices is one option, another option with lower cost is to use the tachometers of the fans in the computing devices themselves to periodically measure airflow in various locations in the data center.

A method for measuring airflow for a plurality of computing devices is contemplated. In one example embodiment, the method may comprise connecting the computing devices via a network and positioning them on one or more racks. Each of the computing devices has at least one cooling fan configured to exhaust heat into a hot aisle between the racks. The cooling fans have a rotor and a tachometer configured to measure the rotor's rotations. Computing workloads are distributed to the computing devices via the network, and the computing devices perform work (e.g. calculations or processing tasks) on the computing workloads.

In order to measure airflow in the data center, the management application selects one of the computing devices and sends it a measurement instruction. The device reduces power to its fan(s) so that they can spin due to ambient airflow rather than electrical motive force. RPM information is read from the fan tachometer(s) and is sent back to the management application. To prevent overheating, work on the computing workloads is paused or halted while the fan(s) are powered down and the RPM information is being read. An airflow value may be calculated according to a formula based on the fan's dimensions and pitch or it may be looked in based on a table of predetermined airflow values. The measurements may be periodically repeated for different computing devices in different locations in the data center in order to get an accurate picture of the airflow and pressures in the data center.

In some embodiments, malfunctioning computing devices may be detected. While malfunctioning, if these devices are capable of operating their fan and communicating on the network; they may be configured to operate in a fan-only mode until they are repaired. While in fan-only mode the device may be configured to refrain from performing any work on the computing workloads and operate the device's fan to prevent hot air from traveling from the hot aisle through the malfunctioning computing device to the cold aisle. The fan-only mode device may be configured to periodically reduce fan power and read RPM information from the fan's tachometer. In some embodiments, fan-only mode may be applied via a network-delivered computing device firmware update.

A computer-readable storage medium storing instructions executable by a processor of a computational device such as a management server is also contemplated. When executed, the instructions may cause the management server to execute a management application that distributes computing workloads to network-connected computing devices positioned on one or more racks in a data center. Each computing device has at least one cooling fan configured to exhaust heat into a hot aisle between the racks. Each cooling fan has a rotor and a tachometer configured to measure the rotor's rotations. The management application causes the computing devices to perform work on the computing workloads and selects one of the computing devices to measure airflow by sending a measurement instruction that causes the computing device's controller to reduce fan power so that ambient air flow may turn the selected computing device's fan counter to the fan's normal spin direction. The controller then reads RPM information from the fan's tachometers. The management application or controller may stop or pause work on the computing workloads while reading the RPM information. The management application may calculate an airflow value based on the RPM information read by the selected computing device and create a map of airflow by repeating the measuring, reducing power, and reading steps at different times for different computing devices at different known locations within the data center.

A computing device is also contemplated. In one embodiment the device may comprise a controller configured to manage the computing device, a plurality of processors in communication with the control and configured to perform calculations, a case containing the processors, and a fan with a tachometer. The fan may be configured during normal operation to spin in a first direction that draws cool air into the case and exhausts hot air out of the case in a particular direction. The tachometer may be configured to measure rotation of the cooling fan, and the controller may be configured, in response to executing a measurement instruction, to reduce power to the fan so that ambient air pressure may turn it in a direction counter to the first direction and read RPM information from the first tachometer. The controller may also be configured to cause the processors to refrain from performing work on the computing workloads while the controller is reading the RPM information (e.g., to prevent overheating). The computing device may also include a network adapter that the controller can use to send the RPM information via a network.

Systems and methods for cooling computing devices in a data center and measuring airflow are disclosed. The computing devices may have cooling fans that can have their fan speed set by management instructions. The devices may be mounted in racks between cold aisles and hot aisles and may be connected via network switches. The computing devices may be oriented so that their cooling fans operate to exhaust waste heat to one side of the rack. Measurement instructions may be sent to selected computing devices to cause them to go into a lower power state that may reduce or stop computational work and/or may reduce electrical power to the cooling fan so that the fan does not spin based on the electromotive force and can instead spin in an opposite direction based on ambient airflow caused by a difference in air pressure from the hot aisle to the cold aisle. Tachometers in the cooling fans may be used to measure RPM information that can be used to determine airflow, update patterns of fan settings sent to the computing devices, and/or create an airflow map of the data center.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
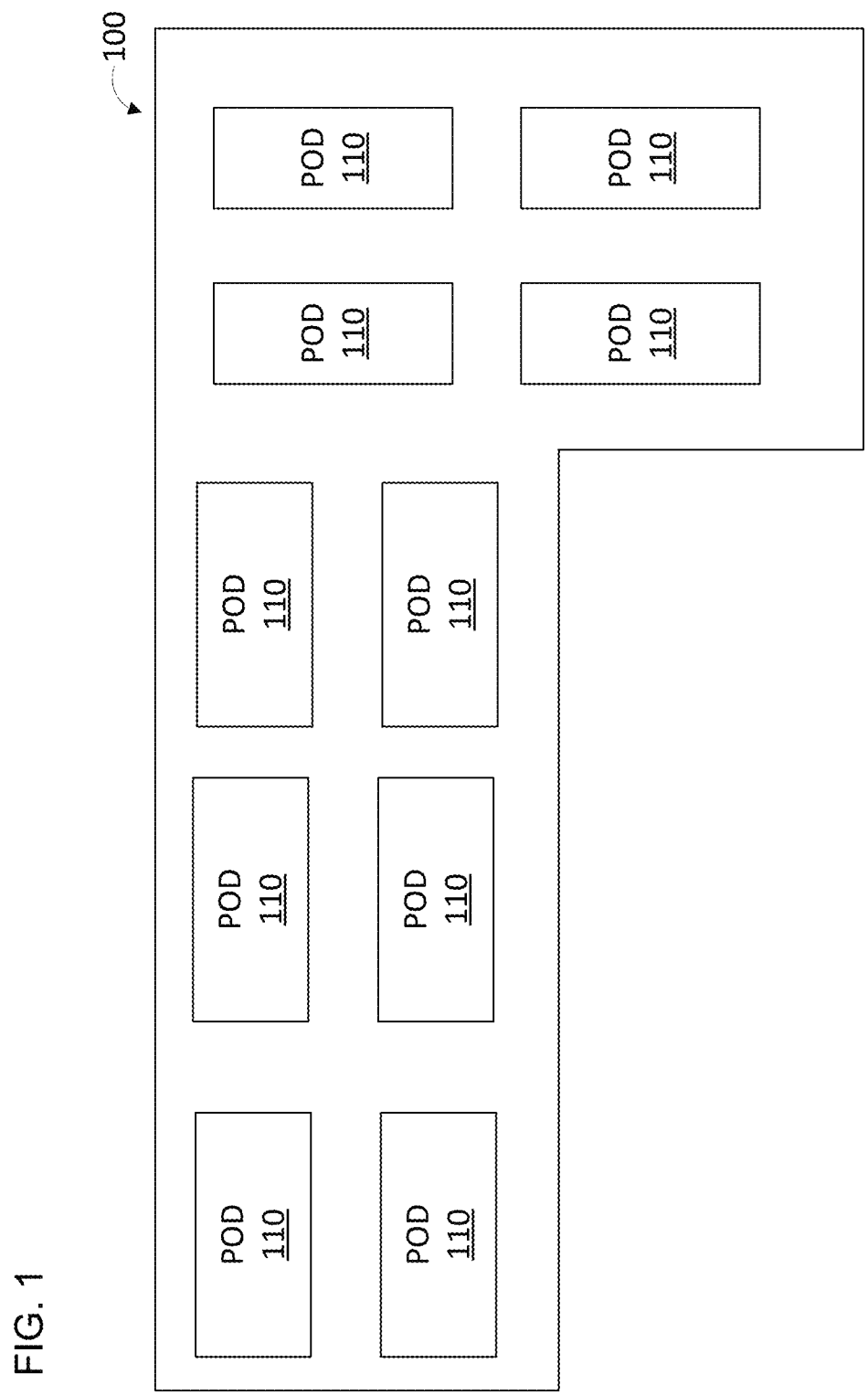
FIG. 1 is a top-down view of one example embodiment of a data center for computing devices.

Referring now to FIG. 1, a top-down view of one example of a data center 100 for computing devices is shown. The data center 100 is configured with a large number of pods 110. Pods are standardized blocks of racks, either in a row or (more typically) a pair of rows that share some common infrastructure elements like power distribution units, network routers/switches, containment systems, and air handlers. For example, a pod may have two parallel racks of devices, spaced apart and each facing outwards. The devices on the racks may all be oriented to pull cool air in from outside the pod and discharge the hot air (heated by the computing devices) into the empty space in the center of the pod where the hot air then rises up and out of the data center. For example, there may be one or more exhaust openings (e.g., positioned at one end of each pod or above the center of each pod) to capture the hot waste air and then discharge it out of the data center via vents in the roof of the data center.

Figure 2:
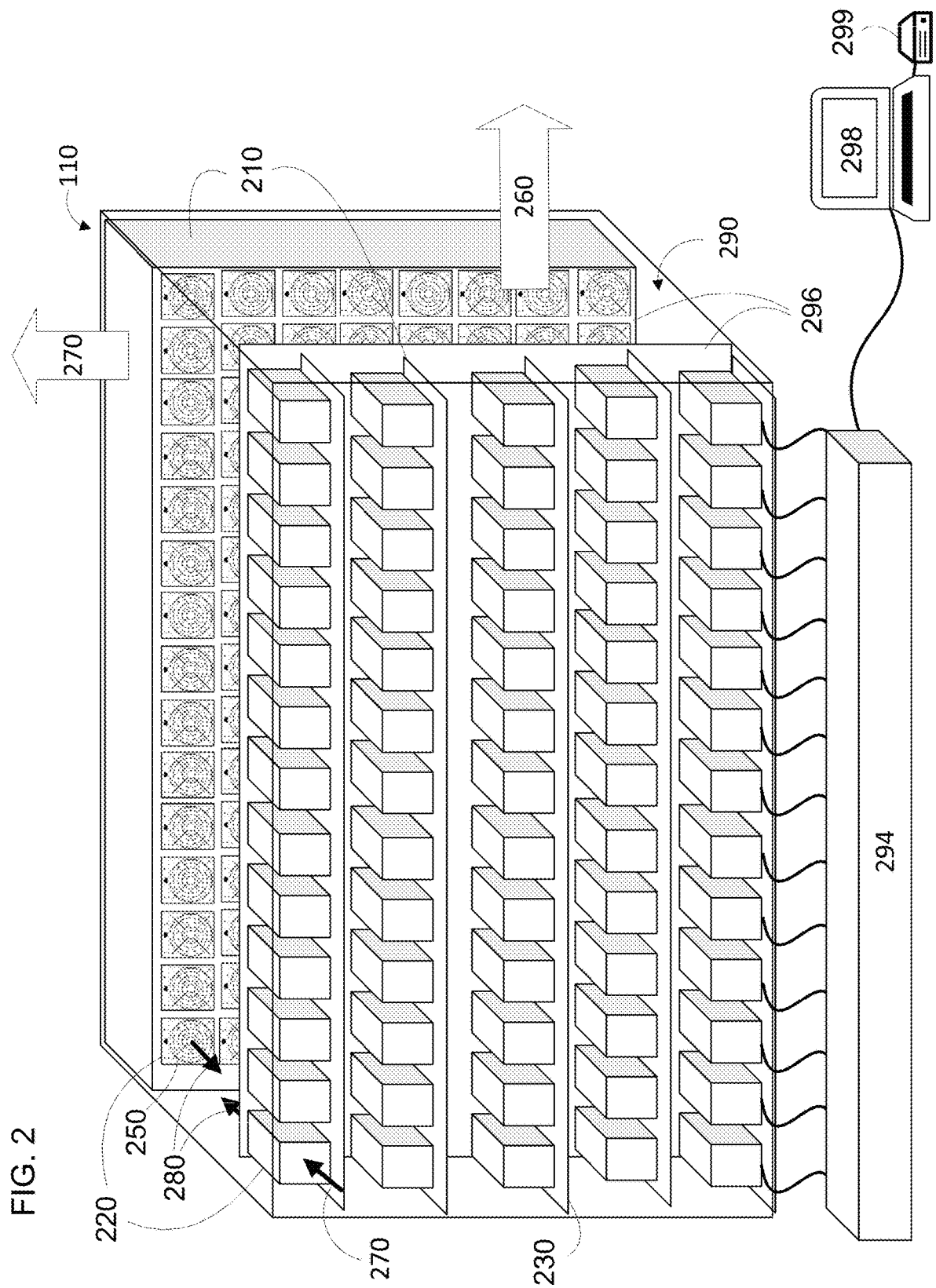
FIG. 2 is a perspective view of one example embodiment of a pod housing computing devices in a data center according to the teachings of the present disclosure.

Turning now to FIG. 2, a perspective view of one example of a pod 110 is shown. This example of pod 110 has racks 210 that each have a number of shelves 230 for holding computing devices 220, thereby creating a two-dimensional array of computing devices on each rack or group of racks. In other embodiments, racks 210 may have rails that hold computing devices 220 in place of shelves 230. Each computing device 220 has one or more cooling fans 250 configured to draw air from outside the pod into the computing device for cooling, as shown by arrow 270. The moving air draws heat from computing device 220 and is exhausted from the computing device as shown by arrows 280.

In some embodiments, computing device 220 may have two fans, one on the intake side and one on the exhaust side. In other embodiments multiple smaller fans may be used within computing device 220. Heated air is exhausted by computing devices 220 into the space 290 between racks 210, often called a hot aisle. The space between racks 210 is typically sealed except for one or more exhaust openings through which the heated air exits. In some embodiments, these openings may be at the side, with heated air exiting as indicated by arrow 260. In other embodiments, these exhaust openings may be located at the top of hot aisle 290 with the heated air exiting above the pod as indicated by arrow 270. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust vents.

Computing devices 220 are networked together with network switch 294 and may be organized by mapping physical computing device positions within the pod, rack and shelf by the network ports on switch 294. This network connection allows management instructions and computing jobs to be sent to each computing device 220, and data such as device status information (e.g., temperature information) and results of the computing jobs to be returned. Switch 294 may also be connected to other networks such as the internet, as well as a management computer 298 that is configured to execute a management application (e.g. stored on computer readable media 299) to manage computing devices 220. Management computer 298 may be a traditional PC or server, or specialized appliance. Management server 298 may be configured with one or more processors, volatile memory and non-volatile memory such as flash storage or internal or external hard disk (e.g., network attached storage). The management application or module is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C#, or Rust. The program code may execute entirely on the management computer 298 as a stand-alone software package, partly on the management computer 298 and partly on a remote computer or computing devices 220, or entirely on a remote computer or computing devices 220.

In order to better cool computing devices 220, the management application may be configured to dispatch instructions to computing devices 220 setting their fan speeds according to one or more predetermined patterns as described in greater detail below. While different computing devices will have different interfaces for setting fan speed, one example is that the computing device will have a network port open that will accept management commands such as setting the fan speed, voltage level, operating frequency, etc. The management application may provide a user interface for simplified management. For example, the management application may be configured to create a model of the data center based on device to port mappings and permit the user to specify a maximum setting (e.g., maximum fan setting), a minimum setting (e.g., minimum fan settings), and a type of pattern (e.g., linear gradient or cubic). With this information the management application may then automatically calculate the values (e.g., fan speed settings) for each computing device based on the distribution of the computing devices on the rack. In another embodiment, the management application may prompt the user to fill in one or more grids (as shown for example in FIG. 7) with values for each pattern. The management application may also prompt the user to specify timing and the direction for any desired shifts or rotations of the patterns.

While the illustrated examples show the computing devices 220 arranged in two-dimensional arrays that are planar and perpendicular to the floor, other arrangements are possible and contemplated. For example, the two-dimensional array may be sloped or angled relative to the floor (e.g., with each shelf angled and or offset from the one below it) and or non-planar (e.g., with each shelf angled and or offset from the one next to it).

Figure 3:
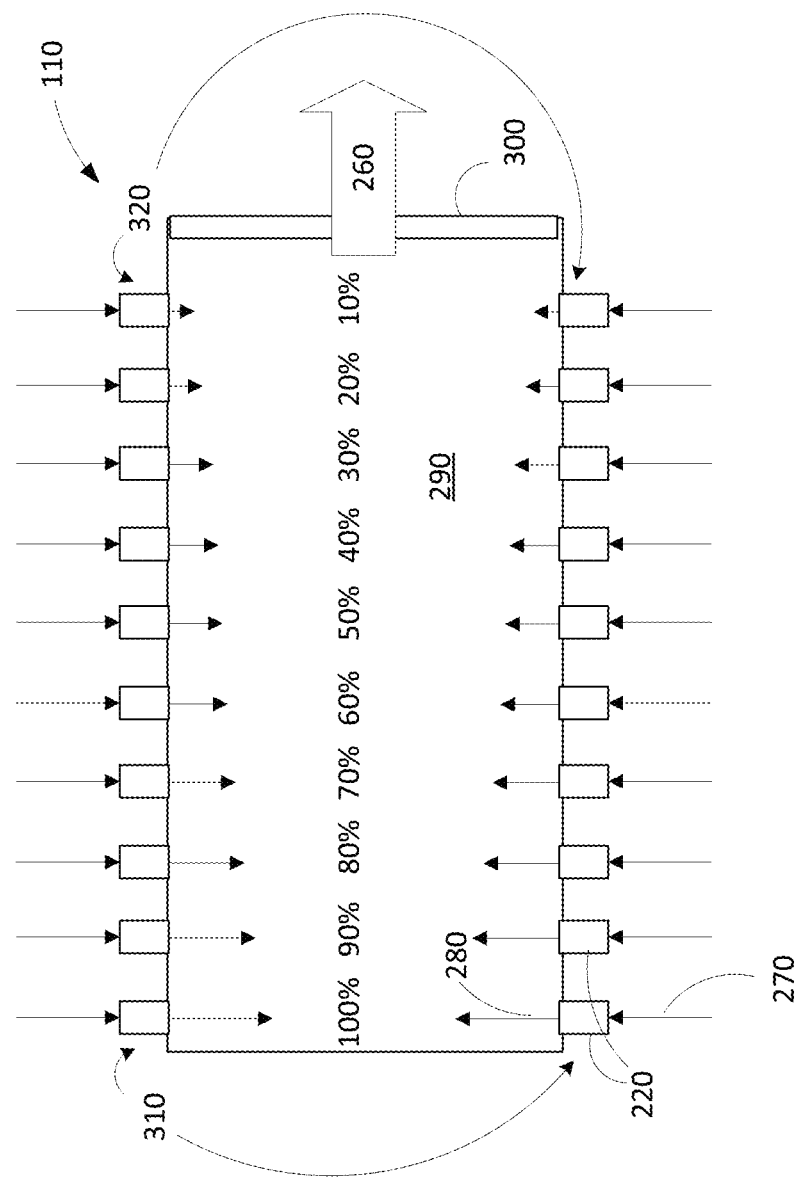
FIG. 3 is a top view of an example embodiment of a system for cooling computing devices in a data center according to the teachings of the present disclosure.

Turning now to FIG. 3, a top down view of an example embodiment of a system for cooling computing devices 220 in a pod 110 in a data center is shown. In this example, computing devices 220 exhaust hot air into hot aisle 290, which is sealed to prevent the hot air from exiting except through exhaust opening 300, as illustrated by arrow 260. To more efficiently and better cool computing devices 220, instructions are sent to computing devices 220 setting their fan speeds according to a pattern. In this example, the pattern starts at maximum fan speed (100%) for computing devices that are farthest from the exhaust opening. In this example, those devices are in columns 310. The pattern then reduces the fan output slightly (e.g., by 10%) for computing devices 220 in each neighboring column, reaching a predetermined minimum fan space (e.g., 10%) for the computing devices in columns 320, which are nearest to the exhaust opening 300.

Figure 4:
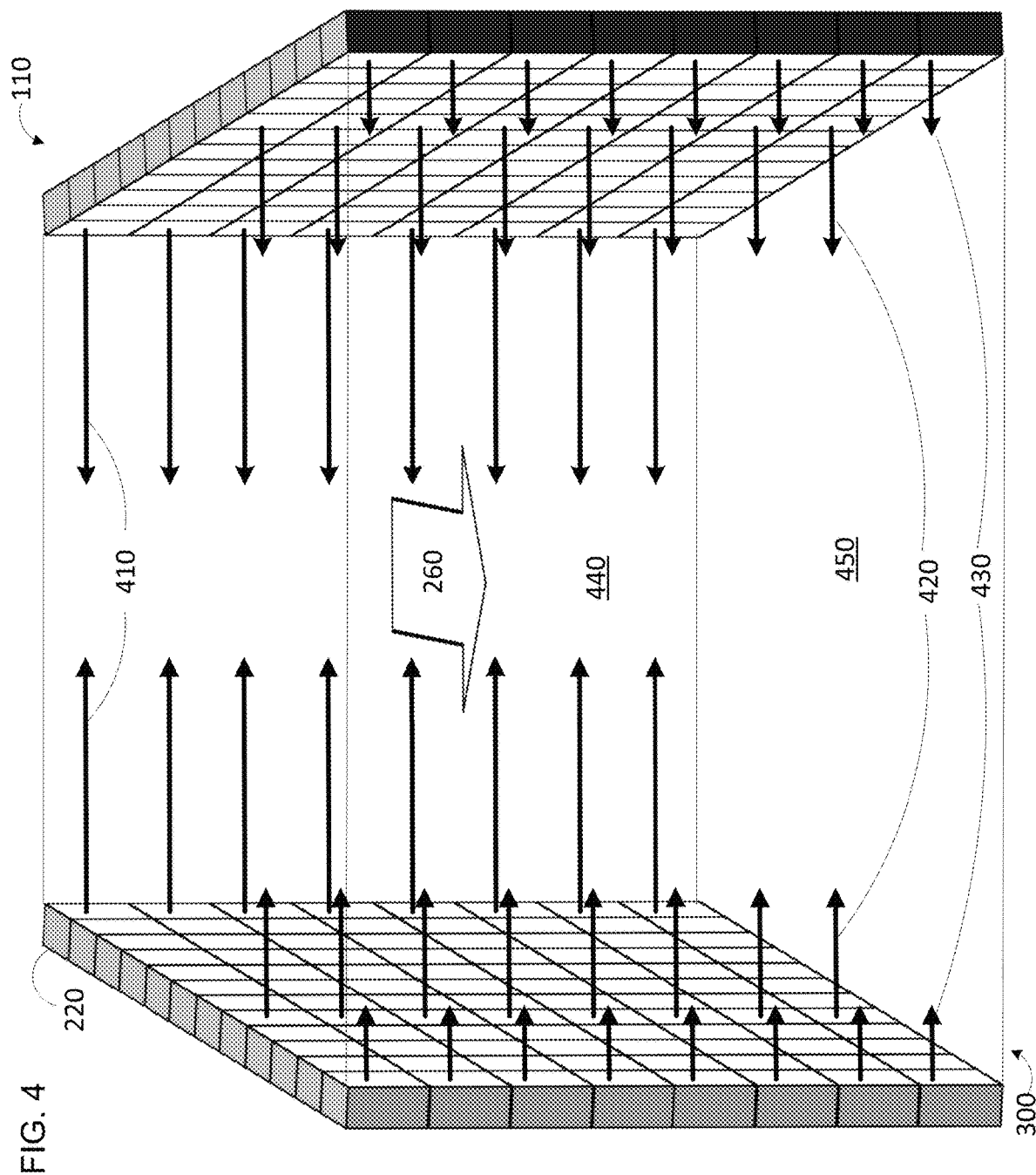
FIG. 4 is a perspective view of an example embodiment of a fan cooling pattern applied to an example pod in a data center according to the teachings of the present disclosure.

Turning now to FIG. 4, a perspective view of the example embodiment from FIG. 3 is shown with each cube representing a computing device 220 and arrows indicating the approximate direction of exhaust and relative fan speed. The top, back 440, and floor 450 of the space between the racks of computing devices 220 are sealed, with one side being open as an exhaust opening 300. The pattern of fan settings applied to computing devices 220 is a gradient in this example embodiment, with fan speed being lowest for computing devices 220 that are closest to the exhaust vent 300 (as indicated by arrows 430), then gradually increasing for computing devices 220 in each column that is farther away from the exhaust opening 300 (as indicated by arrows 420) until the highest fan speed settings are applied to the computing devices 220 that are farthest from the exhaust opening 300 (as indicated by arrows 410). The general direction of exhaust airflow is from the back to the front and out the exhaust opening 300 as indicated by arrow 260.

Figure 5:
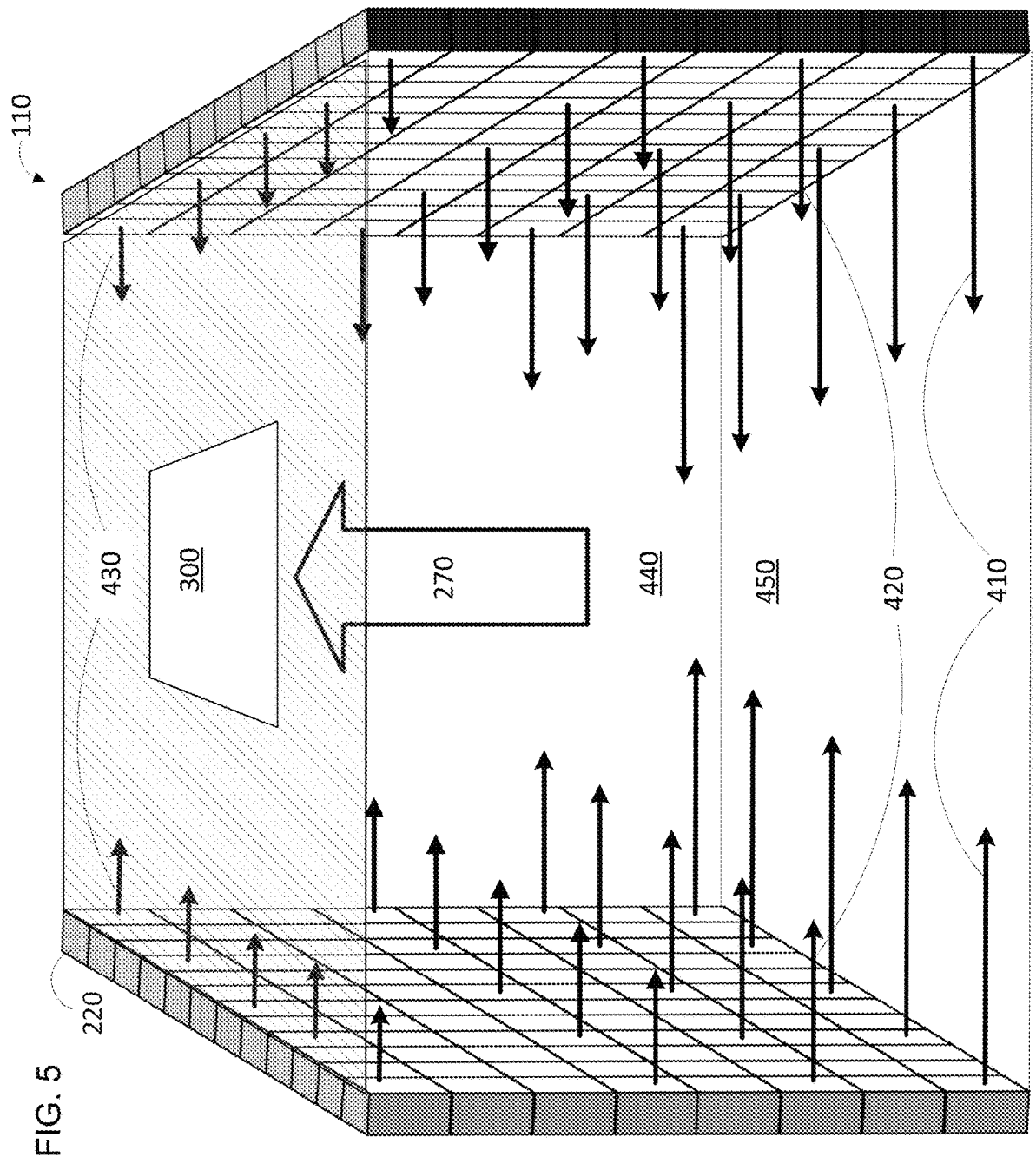
FIG. 5 is another perspective view of another example embodiment of a fan cooling pattern applied to an example pod in a data center according to the teachings of the present disclosure.

Turning now to FIG. 5, a perspective view of another example embodiment of a fan cooling pattern applied to an example pod in a data center is shown. As with the previous example, each cube represents a computing device 220, and arrows indicate the approximate direction and relative air/fan speed. The front, back 440, and floor 450 of the space between the racks of computing devices 220 are sealed, with the top having one or more exhaust openings 300. The pattern of fan settings applied to computing devices 220 is a gradient in this example embodiment, with fan speed being lowest for computing devices 220 that are closest to the exhaust vent 300 (as indicated by arrows 430), then gradually increasing for computing devices 220 in each row that is farther away from the exhaust opening 300 (as indicated by arrows 420) until the highest fan speed settings are applied to the computing devices 220 that are farthest from the exhaust opening 300 (as indicated by arrows 410). The general direction of exhaust airflow is bottom up and out the exhaust opening 300 as indicated by arrow 270. While linear gradient patterns have been illustrated, the pattern or gradient applied can be linear or nonlinear (e.g. exponential, cubic, quadratic). The pattern can also vary in two dimensions, as illustrated in the next example.

Figure 6:
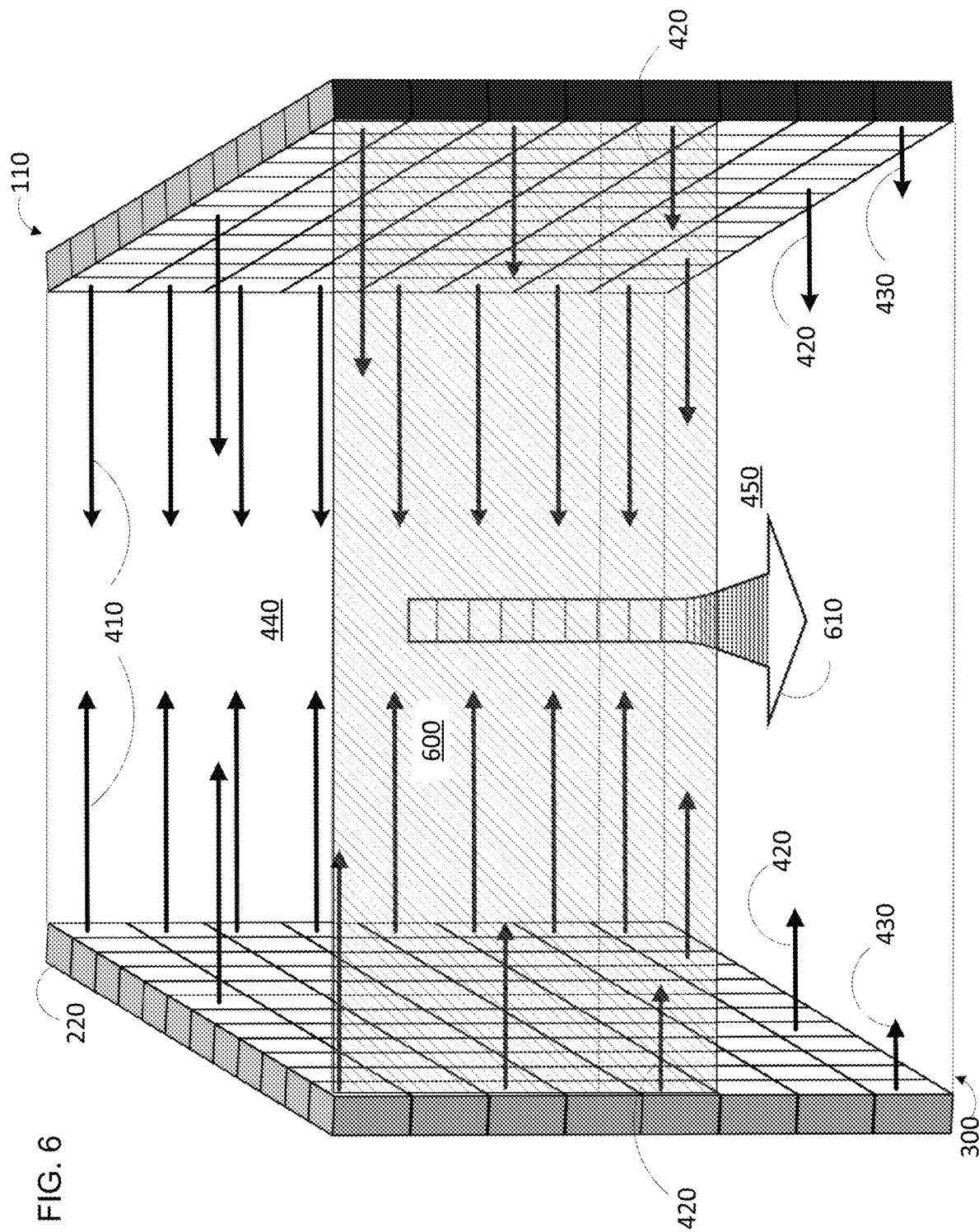
FIG. 6 is another perspective view of an example embodiment of a fan cooling pattern applied to an example pod in a data center according to the teachings of the present disclosure.

Turning now to FIG. 6, a perspective view of another example embodiment of a fan cooling pattern applied to an example pod in a data center is shown. As with the previous example, each cube represents a computing device 220, and arrows indicate the approximate direction and relative air/fan speed. The ceiling, back 440, and floor 450 of the space between the racks of computing devices 220 are sealed, with part of the front being sealed by barrier 600 and part being an exhaust opening 300. The pattern of fan settings applied to computing devices 220 is a two-dimensional gradient in this example embodiment, with fan speed being lowest for computing devices 220 that are closest to the exhaust vent 300 (as indicated by arrows 430), then gradually increasing for computing devices 220 that are farther away from the exhaust opening 300 (as indicated by arrows 420) until the highest fan speed settings are applied to the computing devices 220 that are farthest from the exhaust opening 300 (as indicated by arrows 410). The general direction of exhaust airflow is down and out the exhaust opening 300 as indicated by arrow 610. Exhaust openings are generally preferably positioned higher because the heated air naturally rises, but limitations in the building used for the particular data center may dictate other positions like the one illustrated.

Figure 7:
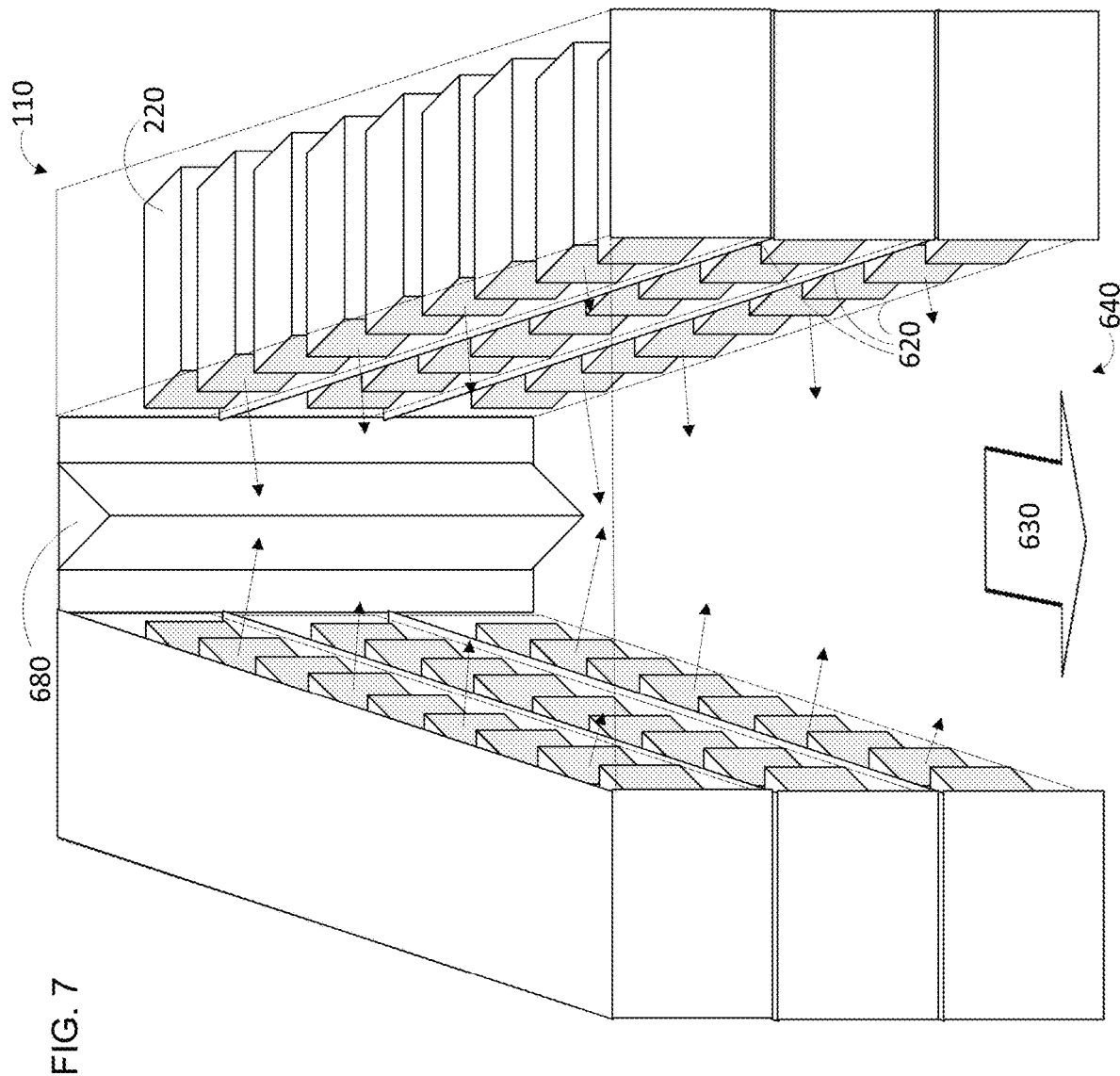
FIG. 7 is another perspective view of an example embodiment of a fan cooling pattern applied to an example pod with horizontally angled computing devices according to the teachings of the present disclosure.

Turning now to FIG. 7, an illustration of another example embodiment of a system for cooling devices in a data center is shown. In this example embodiment, each computing device 220 is positioned so as direct exhaust heat at an angle (i.e., not perpendicular to the shelves 620). This angle may be substantially consistent across all computing devices 220, or the angle may gradually increase the closer the computing devices are to the exhaust opening 640. This angle contributes to the airflow out the exhaust opening 640, as indicated by arrow 630. In some embodiments, there may also be one or more air deflectors 680 positioned between the opposing racks in pod 110. Air deflectors 680 may be used to compensate for obstructions (e.g., pillars) within the pod and may be angled to direct exhaust air toward exhaust opening 640.

Figure 8:
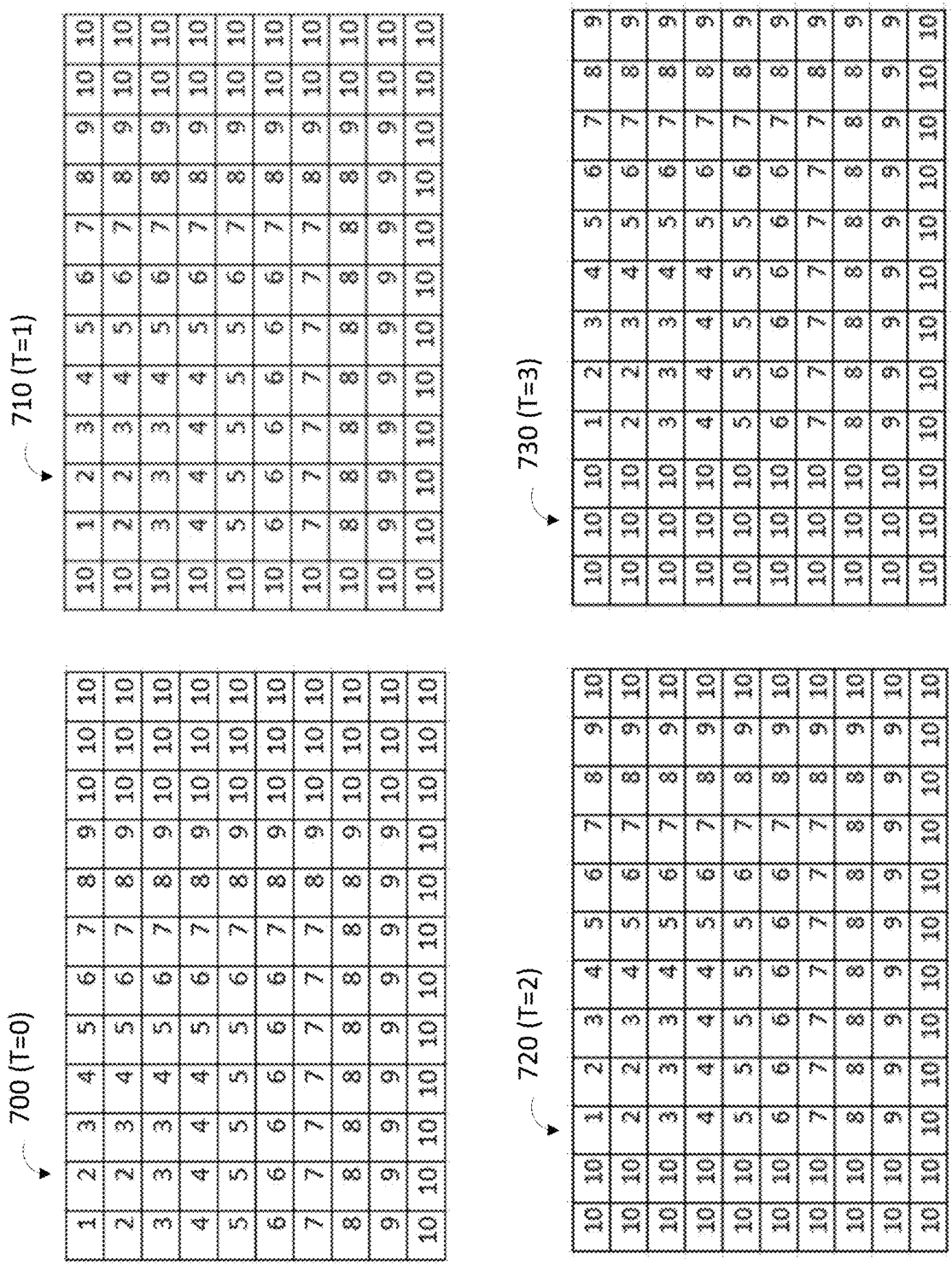
FIG. 8 is an illustration of an example embodiment of a pattern for fan power settings according to the teachings of the present disclosure.

Turning now to FIG. 8, an illustration of an example embodiment of a pattern for fan power settings is shown. In this embodiment, each cell represents a percentage of maximum fan speed, for example with 10 representing 100% of the computing device's maximum fan speed, 9 representing 90% of the computing device's maximum fan speed, and so on. In this embodiment, the pattern changes over time, with pattern 700 being a first pattern sent to the computing devices on a rack at a starting time T=0, pattern 710 being a second pattern sent to the same computing devices at a later time T=1, pattern 720 being a third pattern sent to the same computing devices at a still later time T=3, and pattern 730 being a fourth pattern sent to the same computing devices at a later time T=4.

In some embodiments, the pattern may be periodically shifted and or rotated and resent to the computing devices as shown. This coordinated dynamic changing of fan speeds may beneficially be used to prevent static areas with reduced air flow that may build up heat and create hot spots in the rack, pod, or data center. The pattern shifting may be horizontal, vertical, or some combination thereof. In some embodiments, entirely different patterns may be applied at different times to the computing devices instead of, or in combination with, shifting and or rotating a single pattern.

In some embodiments, the pattern may comprise not only fan settings, but a combination of fan settings and one or more other operating settings for the computing devices (e.g., voltage levels and operating frequencies) that also impact the heat generation and cooling of the computing device.

Figure 9:
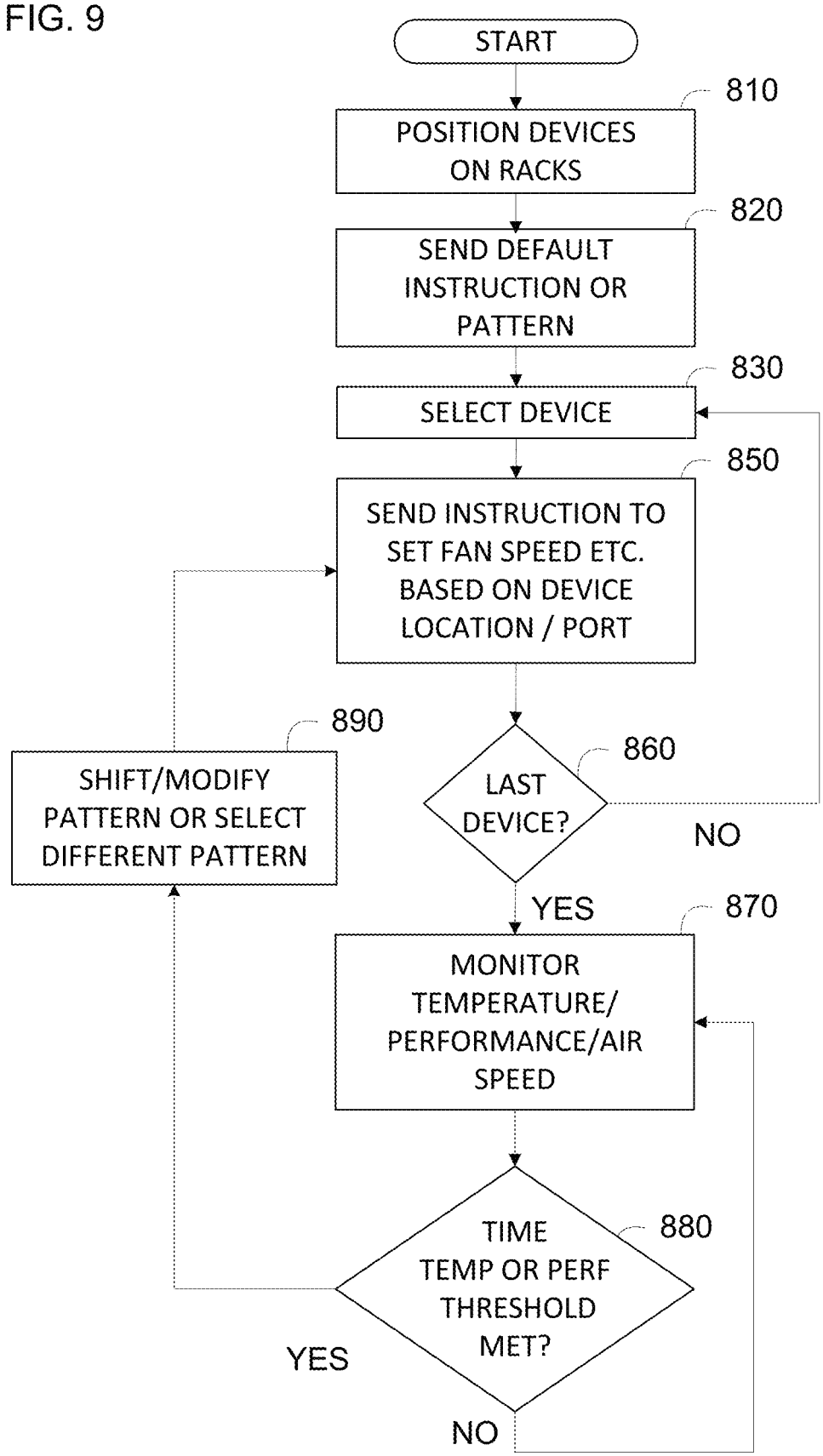
FIG. 9 is a flow chart of an example embodiment of a method for cooling computing devices in a data center according to the teachings of the present disclosure.

Turning now to FIG. 9, a flow chart of an example embodiment of a method for cooling computing devices in a data center according to the teachings of the present disclosure is shown. This method may for example be implemented in software as a management application executing on a management computer that manages the computing devices in the data center. In the embodiment illustrated in the figure, the computing devices are positioned on racks (step 810), and a default instruction that sets an initial pattern is sent (step 820). The instruction is applied to the computing devices by selecting each device (step 830) and sending the appropriate management instruction or instructions to the device (step 850). The management instructions may set the fan speed to a particular value (e.g., percentage of maximum fan speed, tachometer or rotations per minute (RPM) setting, a pulse width modulation (PWM) setting such as duty cycle), or device voltage level or operating frequency, or some combination thereof. Depending on the computing devices being managed, this may be accomplished in a number of different ways, for example via SSH, TCP/IP, HTTP or other network protocol. This is repeated for each device until the last device is set (step 860). The temperature and/or performance of the computing devices is monitored (step 870), and if any thresholds are met such as a maximum desired temperature or performance below a certain threshold (step 880), a new pattern may be selected, or a pattern shift, change, or sequence of shifts/changes may be triggered (step 890). In addition to temperature in the computing device, temperature at various locations in the data center may be measured via network-enable thermometers, and the airspeed of air through or near the computing devices may be monitored (step 870) by reading a speed value from one or more tachometers connected to one or more of the computing devices fans, or by reading values from one or more network-connected airspeed detectors placed at measuring locations within the hot aisle(s) of the data center.

Figure 10:
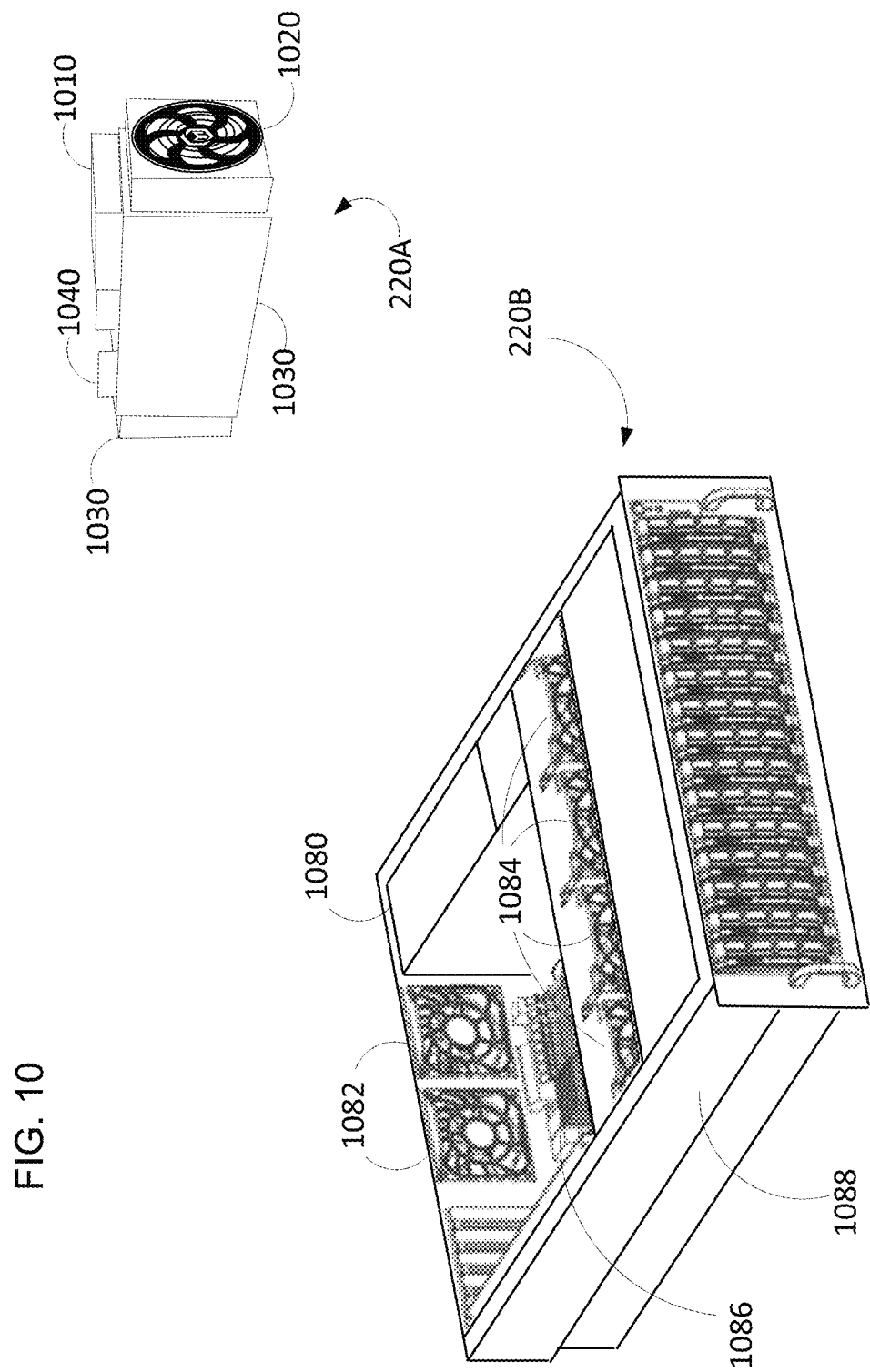
FIG. 10 is an illustration of two example computing devices with cooling fans in accordance with the teachings of the present disclosure.

Turning now to FIG. 10, an illustration of two example embodiments of computing devices 220A and 220B with cooling fans in accordance with the teachings of the present disclosure is shown. Computing device 220A comprises two cooling fans 1020 and 1030 (one on each side) that are configured to remove heat from computing device 220A by drawing cool air into the computing device's case 1030 from a cool aisle (e.g., one side of the rack on which the computing device 220A is positioned) and exhausting it into a hot aisle (e.g. the opposite side of the rack from the cold aisle). Computing device 220A also has a controller 1040 and one or more processors 1010 (e.g., CPUs, GPUs, FPGAs, or ASICs) configured to perform work on computations workloads (e.g., calculate hashes, perform graphics rendering, or data processing).

Computing device 220B is another example embodiment, in this case in a more traditional rack-mount configuration. Computing device 220B has multiple fans in multiple locations within its case 1088 shown without its top for illustration purposes. Center fans 1084 pull cool air from the cool aisle into the front of case 1088 and push the air across the motherboard 1086 that has controllers and processors on it. Rear fans 1082 assist in exhausting the heat from within computing device 220B out the rear of case 1088 into a hot aisle. Power supply 1080 provides power at appropriate voltage levels for each part of computing device 220B, including the fans 1082-1084 and components on motherboard 1086.

Figure 11:
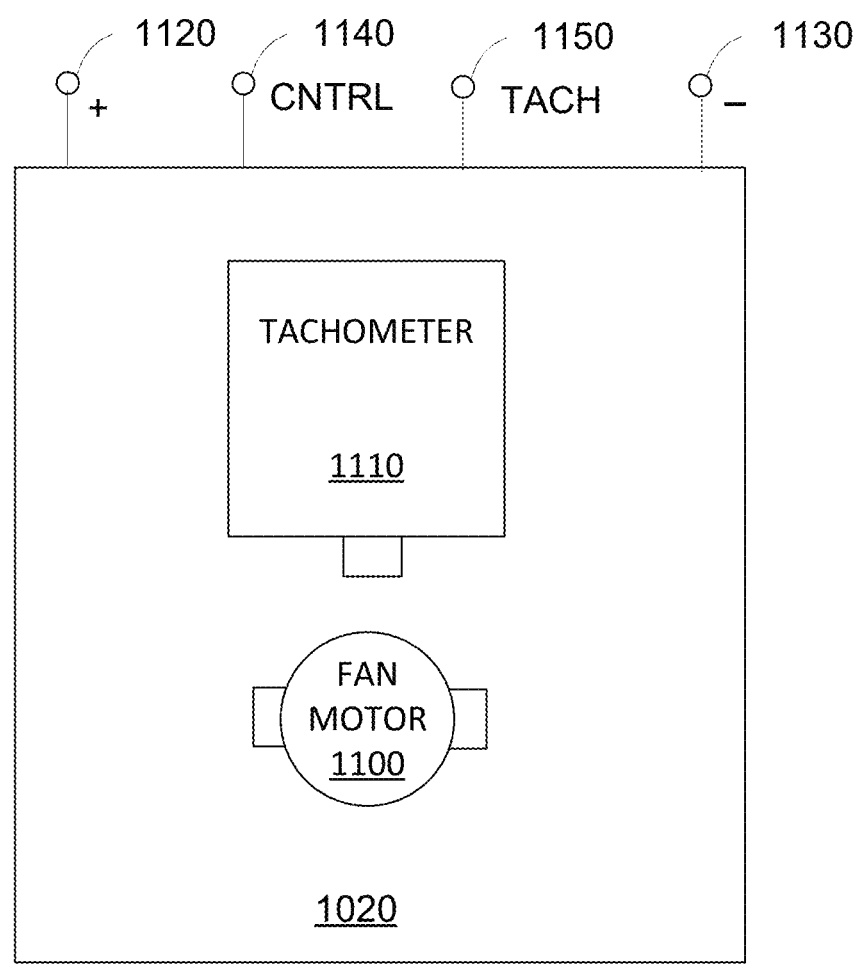
FIG. 11 is an illustration of one example of a cooling fan in accordance with the teachings of the present disclosure.

Turning now to FIG. 11, an illustration of one example embodiment of cooling fans 1020, 1082-1084 in accordance with the teachings of the present disclosure is shown. In this example, cooling fan 1020 comprises a fan motor 1100 (connected to a rotating fan rotor with fan blades), a tachometer 1110, and a four-wire connector. The four wires are a positive voltage input 1120, a negative or ground input 1130, a control input 1140, and a tachometer output 1150. The fan motor 1100's speed is controlled by control input 1140 (e.g., via pulse width modulation "PWM"). Tachometer 1110 may for example be a hall effect sensor or optical sensor that is configured to generate electrical signal pulses as the fan motor 1100 spins. These signals convey rotation per minute ("RPM") information for the fan via tachometer output 1150. In some embodiments the RPM information may be a multiple of the actual RPM of fan motor 1100 (e.g., the signal on tachometer output 1150 from tachometer 1110 may be double the actual RPM if two magnets on the fan rotor pass tachometer 1110's hall sensor during each rotation).

In normal operation, the fan motor 1020 spins in one direction (e.g., clockwise) at a speed controlled by control wire 1140. However, it may be advantageous to occasionally or periodically turn off the power to fan motor 1100 (e.g., by setting control input 1140 to a pulse width having a zero or near zero duty cycle) such that the fan motor is not being actively driven by electromotive force. This may allow ambient airflow to spin the fan rotor instead. The pressure in the hot aisle is often significantly higher than in the cool aisle, and this pressure differential can create enough airflow (going through the computing device in the opposite direction to normal operational airflow) to cause the fan to spin in the opposite direction (e.g., counterclockwise). This will cause the tachometer to generate RPM information that can be read via output 1150 (e.g., by the controller of the computing device).

Figure 12:
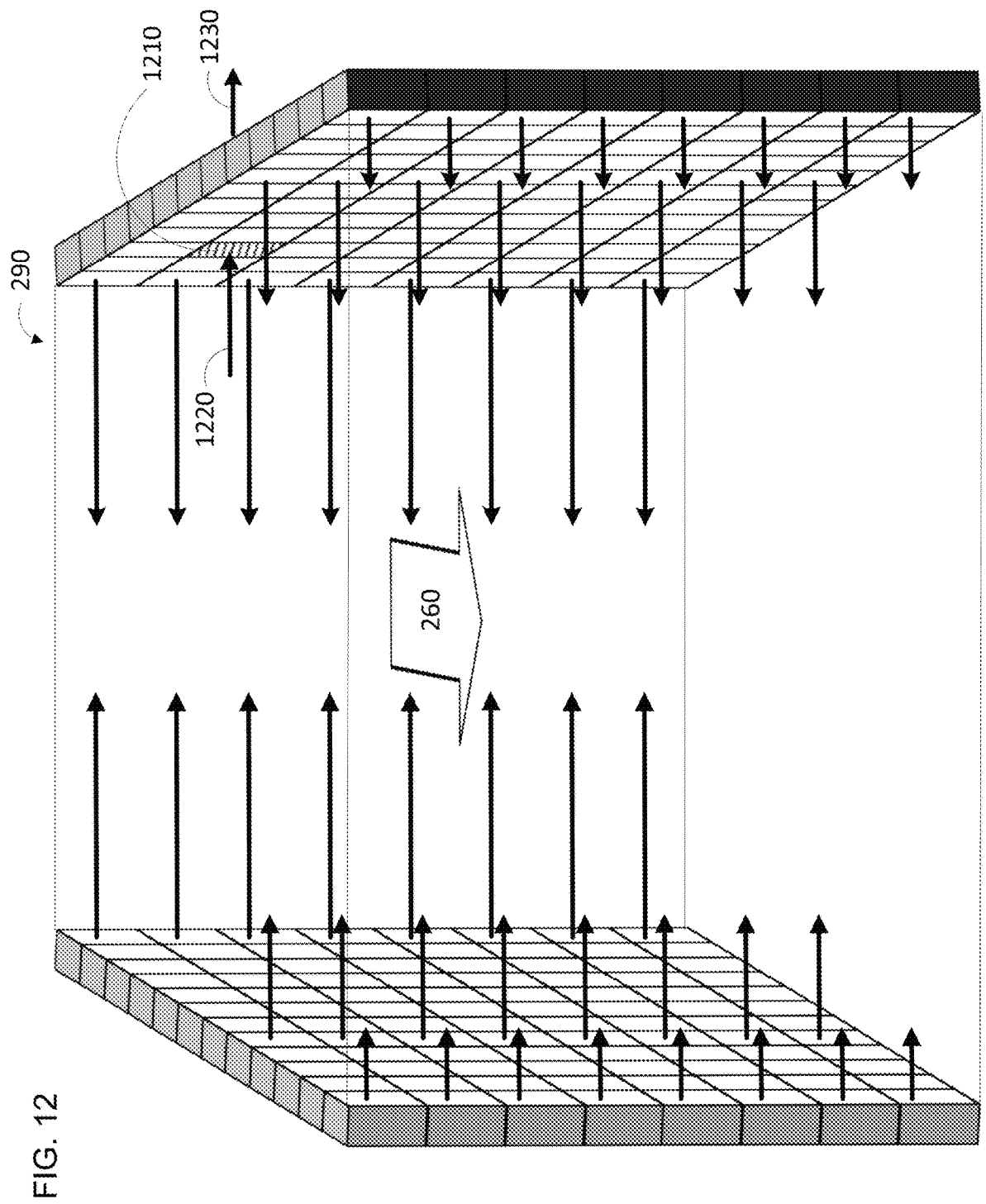
FIG. 12 is a perspective view of an example embodiment of a system for cooling computing devices with one computing device configured to measure airflow according to the teachings of the present disclosure.

This is shown in FIG. 12, where the fan on a selected computing device 1210 has been powered down (or partially powered down, as the tachometer in some fans must still have power in order to function), allowing the higher pressure hot air from hot aisle 290 to briefly escape through computing device 1210 as shown by arrows 1220 and into the cold aisle 1230. In order to prevent computing device 1210 from overheating, work on computational work loads can be temporarily stopped (e.g. paused or canceled) while the fan is powered down. In some embodiments computational work loads may be stopped prior to powering down the fan in order to permit the computing device to cool down first.

The computing device's controller can relay the RPM information obtained to a management application operating on a management server 298 (as shown in FIG. 2) via the network using the computing device's network adapter. The management application may be configured to calculate airflow based on the RPM information. For example, airflow can be calculated as the linear velocity of air through the fan based on RPM information and the physical characteristics of the fan (e.g. fan diameter and blade pitch/angle). Alternatively, a table of air speeds versus RPM may be precalculated for different fan speeds based on the characteristics of the fan, and the management application may simply perform a lookup in the table after receiving RPM information from the computing device.

If the computing device has two or more fans, the other fans may be powered down in order to better measure the airflow through the device. In some embodiments each fan's tachometer information may be received and used. For example, the RPM information may be averaged for fans in series such as fans 1020 and 1030 in device 220A (see FIG. 10), or by adding them for side-by-side fans such as fans 1084 in computing device 220B (see FIG. 10). The airflow value (which is proportional to the air pressure difference across the cold aisle and hot aisle at the computing device's location) can be used to generate an air flow or air pressure map of the data center. Periodically, different computing devices in different locations in the data center can be selected by the management application and sent instructions that cause them to measure the airflow. The management application may also be configured to update the patterns of fan speed settings sent to the arrays of computing devices in the racks based on the air pressure measurements. For example, where measured airflow is less than desired, the fan speeds in neighboring devices can be increased. If measured airflow is higher than desired, the fan speeds in neighboring devices can be decreased.

Once the measurement instructions are completed and the RPM information has been conveyed, the computing device may be configured to restart normal operation with work proceeding on computational workloads and the fan cooling the computing device by spinning in the normal direction and once again drawing cool air from the cool aisle back into the computing device and exhausting hot air into the hot aisle.

Figure 13:
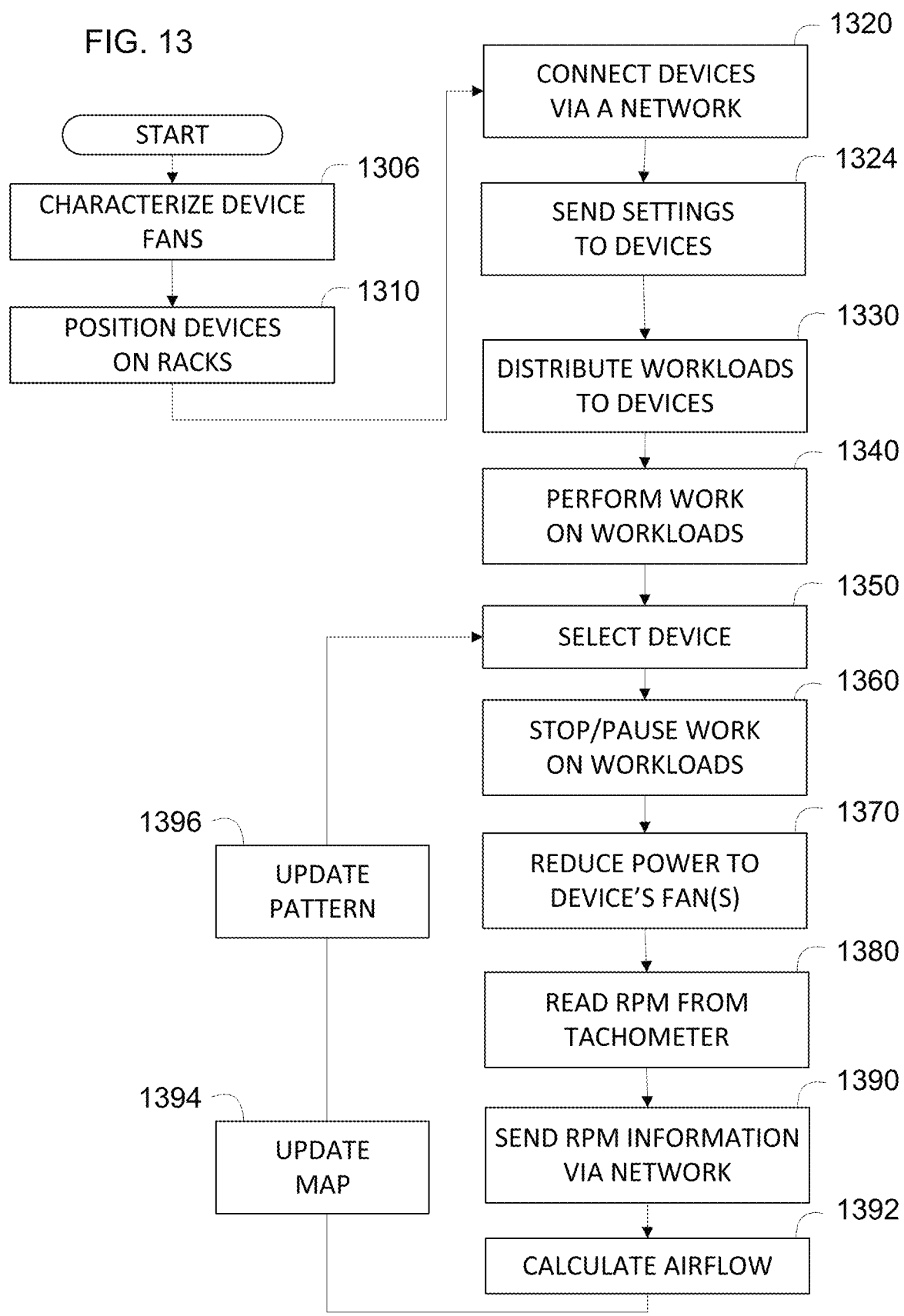
FIG. 13 is a flow chart of an example embodiment of a method for cooling computing devices in a data center according to the teachings of the present disclosure.

Turning now to FIG. 13, a flow chart illustrating an example embodiment of a method for cooling computing devices in a data center is shown. In this embodiment, the fans on devices are characterized (step 1306). For example, each device (or a representative of type of device) may be connected and powers up in an isolated room or an area of the data center without other fans nearby, and the airflow generated by the device's fans at different power settings (e.g., 25%, 50%, 75%, 100%) can be measured with an airflow meter. Alternatively, a lookup can be performed based airflow performance curves published by the manufacturer of the particular type of fan or fans used in the device (e.g., make and model). The assembled table of expected airflows per power setting for each device type or fan type may be stored for later use.

The devices are positioned on the racks (step 1310) such that each device has a known location and is drawing cool air from the cool aisle and exhausting heat into the hot aisle. The devices are connected to a network (step 1320), and the management application uses the network to send settings to the devices (step 1324) including fan speeds (e.g., according to an initial predetermined pattern) and voltage levels.

Compute workloads are sent to the computing devices (step 1330), and the devices perform work on the workloads (step 1340). Once measurements are desired, a computing device is selected for measurement (step 1350), and its work on computational workloads is paused or stopped (step 1360). In some embodiments, this may include resetting the computing device and then putting it into measurement mode. The power to the computing device's fan(s) may for example be set to zero, or to a reduced power level, e.g., the motor may be stopped but power may still be provided to the tachometer (step 1370). Then RPM information is read from the tachometer (step 1380) and sent via the network (step 1390) to the management application, which uses the information to calculate airflow (step 1392). This information can be used to create and update a map of airflow/air pressure in the data center based on the device's position in the data center (step 1394), and the pattern of fan settings can also be updated based on the RPM information and/or map (step 1396). This process can be periodically repeated. The airflow or air pressure (e.g., backpressure) at the device's location in the data center may be measured directly (e.g., with the fan's power set to zero and the fan spinning in reverse relative to its normal direction of spin when powered up). Or the air flow/pressure may be measured indirectly based on the difference of the expected zero-pressure RPM (as characterized in step 1306) and the actual measured RPM.

In some embodiments, the device or device fan may not be put into a reduced power mode. Instead, the device's measured fan RPM at full power (e.g., 100%) may be compared with the device's characterized full power RPM measurement (from step 1306), and the difference may be used to calculate the backpressure at the device's location in the data center. For example, if the device reports an RPM of 3650 at a 100% fan power setting when characterized (i.e., with zero backpressure), and the same device later reports an RPM of 3200 when installed in a location in the data center with other devices operating and pushing air into the same hot aisle, the difference of 450 RPM can be used to determine the backpressure the device is experiencing at that location.

In some embodiments, as computing devices age they may start to perform poorly. It may take some time for data center technicians to find and repair the problematic device. In one embodiment, the selection of which device to measure (step 1350) may include detecting malfunctioning computing devices and then configuring them to run in fan-only mode. Periodically, these fan-only mode devices can be configured to turn off their fans in order to report airflow information to the management software. In some embodiments this may involve updating the device's firmware to a fan-only mode firmware.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method for measuring airflow for a plurality of computing devices, the method comprising:
    characterizing fan performance of a selected computing device of the plurality of computing devices to provide characterized RPM information;
    positioning the plurality of computing devices on one or more racks, wherein each of the computing devices on each of the one or more racks comprises a cooling fan configured to exhaust heat into a hot aisle, wherein each cooling fan comprises a rotor and a tachometer configured to measure the rotor's rotations;
    connecting the computing devices via a network;
    distributing computing workloads to the plurality of computing devices via the network;
    performing work on the computing workloads on the plurality of computing devices;
    reducing power to the selected computing device's fan;
    reading RPM information from the selected computing device's fan's tachometer; and
    comparing the read RPM information with the characterized RPM information to determine a backpressure value for the selected computing device;
    wherein the power to the selected computing device's fan is reduced prior to reading the RPM information from the selected computing device's fan's tachometer such that the reading of RPM information from the selected computing device's fan's tachometer occurs while power to the selected computing device's fan is reduced.

2. The method of claim 1, further comprising, after reducing power to the selected computing device's fan, spinning the selected computing device's fan via ambient airflow.

3. The method of claim 2, wherein spinning the selected computing device's fan with ambient airflow includes spinning the selected computing device's fan counter to the fan's normal spin direction.

4. The method of claim 1, further comprising controlling the selected computing device's fan via a control input; and wherein reducing power to the selected computing device's fan includes setting the control input such that the selected computing device's fan is not being actively driven by electromotive force.

5. The method of claim 1, wherein:
the selected computing device includes a second cooling fan; and
reading RPM information from the selected computing device's fan's tachometer includes reading the RPM information of both the cooling fan and the second cooling fan of the selected computing device.

6. The method of claim 5, further comprising averaging the read RPM information of the cooling fan and the second cooling fan if the cooling fan and the second cooling fan are disposed in series.

7. The method of claim 5, further comprising summing the read RPM information of the cooling fan and the second cooling fan if the cooling fan and the second cooling fan are disposed side-by-side.

8. The method of claim 1, further comprising determining an airflow value of the selected computing device's fan based on the read RPM information.

9. The method of claim 8, further comprising increasing a fan speed of at least one neighboring computing device of the plurality of computing devices that is disposed proximate the selected computing device if the airflow value of the selected computing device is below a desired value.

10. The method of claim 8, further comprising decreasing a fan speed of at least one neighboring computing device of the plurality of computing devices that is disposed proximate the selected computing device if the airflow value of the selected computing device is above a desired value.

11. The method of claim 8, further comprising creating an airflow map via repeating the reducing step, the reading step, and the comparing step with respect to a plurality of other computing devices, which are disposed in different locations, at different times, wherein the plurality of computing devices comprises the plurality of other computing devices.

12. The method of claim 11, further comprising updating one or more patterns of fan speed settings of the plurality of computing devices based on the airflow map.

13. The method of claim 1, further comprising preventing static areas of reduced airflow via coordinated dynamic changing of fan speeds of fans of at least a subset of the plurality of computing devices.

14. The method of claim 1, further comprising reducing computational workloads of the selected computing device prior to reducing power to the selected computing device's fan.

15. The method of claim 1, further comprising, after reducing power to the selected computing device's fan, spinning the selected computing device's fan via airflow corresponding to a pressure difference between a cold aisle in which the selected computing device is disposed and the hot aisle.

16. A non-transitory, computer-readable storage medium storing instructions executable by a processor of a computational device, which when executed cause the computational device to:

characterize performance of a fan of a selected computing device of a plurality of computing devices connected to a network to generate characterized RPM information for the fan;
distribute computing workloads to the plurality of computing devices positioned on one or more racks in a cold aisle of a data center, wherein the plurality of computing devices each have a cooling fan configured to exhaust heat into a hot aisle of the data center;
modify a fan power provided to the selected computing device's fan;
obtain RPM information for the selected computing device's fan while the fan power is modified; and
compare the obtained RPM information with the characterized RPM information to determine a backpressure value for the selected computing device.

17. The non-transitory, computer-readable storage medium of claim 16, wherein modifying the fan power includes increasing the fan power to full power;
obtaining the RPM information includes obtaining full power RPM information when the fan power is at full power;
the characterized RPM information includes characterized full power RPM information; and
comparing the obtained RPM information with the characterized RPM information includes comparing the obtained full power RPM information with the characterized full power information.

18. A method for measuring airflow for a plurality of computing devices, the method comprising:
positioning the plurality of computing devices at least partially in a cold aisle, wherein each of the computing devices comprises a fan configured to exhaust heat into a hot aisle;
characterizing performance of the fan of a selected computing device of the plurality of computing devices to generate characterized RPM information;
connecting the computing devices via a network;
distributing computing workloads to the plurality of computing devices via the network;
performing work on the computing workloads via the plurality of computing devices while providing electrical power to the fans of the plurality of computing devices;
obtaining RPM information for the selected computing device's fan while not providing electrical power to the selected computing device's fan; and
comparing the obtained RPM information with the characterized RPM information to determine a backpressure value for the selected computing device.

19. The method of claim 18, further comprising:
obtaining second RPM information for a second fan of the selected computing device;
averaging the obtained RPM information and the obtained second RPM information if the fan and the second fan are disposed in series; and
summing the obtained RPM information and the obtained second RPM information if the fan and the second fan are not disposed in series.

20. The method of claim 18, wherein the RPM information is obtained while the selected computing device's fan is spinning counter to a normal spinning direction via ambient airflow corresponding to a pressure difference between the hot aisle and the cold aisle.

21. A method for measuring airflow for a plurality of computing devices, the method comprising:

characterizing fan performance of a selected computing device of the plurality of computing devices to provide characterized RPM information;

positioning the plurality of computing devices on one or more racks, wherein each of the computing devices on each of the one or more racks comprises a cooling fan configured to exhaust heat into a hot aisle, wherein each cooling fan comprises a rotor and a tachometer configured to measure the rotor's rotations;

connecting the computing devices via a network;

distributing computing workloads to the plurality of computing devices via the network;

performing work on the computing workloads on the plurality of computing devices;

reducing power to the selected computing device's fan;

reading RPM information from the selected computing device's fan's tachometer, wherein the power to the selected computing device's fan is reduced prior to reading the RPM information from the selected computing device's fan's tachometer;

comparing the read RPM information with the characterized RPM information to determine a backpressure value for the selected computing device; and preventing static areas of reduced airflow via coordinated dynamic changing of fan speeds of fans of at least a subset of the plurality of computing devices.

22. A non-transitory, computer-readable storage medium storing instructions executable by a processor of a computational device, which when executed cause the computational device to:

characterize performance of a fan of a selected computing device of a plurality of computing devices connected to a network to generate characterized RPM information for the fan, wherein the characterized RPM information includes characterized full power RPM information;

distribute computing workloads to the plurality of computing devices positioned on one or more racks in a cold aisle of a data center, wherein the plurality of computing devices each have a cooling fan configured to exhaust heat into a hot aisle of the data center;

modify a fan power provided to the selected computing device's fan;

obtain RPM information for the selected computing device's fan after the fan power is modified, wherein to obtain the RPM information includes obtaining full power RPM information when the fan power is at full power; and compare the obtained RPM information with the characterized RPM information to determine a backpressure value for the selected computing device, wherein the comparison of the obtained RPM information with the characterized RPM information includes a comparison of the obtained full power RPM information with the characterized full power information.

* * * * *